United States Patent
Bezama et al.

(10) Patent No.: US 8,418,751 B2
(45) Date of Patent: Apr. 16, 2013

(54) STACKED AND REDUNDANT CHIP COOLERS

(75) Inventors: Raschid Jose Bezama, Mahopac, NY (US); Evan George Colgan, Chestnut Ridge, NY (US); John Harold Magerlein, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1177 days.

(21) Appl. No.: 12/120,069

(22) Filed: May 13, 2008

(65) Prior Publication Data

US 2009/0283244 A1 Nov. 19, 2009

(51) Int. Cl.
*F28F 7/00* (2006.01)
*H05K 7/20* (2006.01)

(52) U.S. Cl.
USPC .................. 165/80.4; 165/104.33

(58) Field of Classification Search .......... 165/80.4, 165/80.3, 104.33, 109.1; 361/698, 699; 257/714
See application file for complete search history.

(56) References Cited

U.S. PATENT DOCUMENTS

| | | | | |
|---|---|---|---|---|
| 5,365,400 A | * | 11/1994 | Ashiwake et al. | 361/752 |
| 5,592,363 A | * | 1/1997 | Atarashi et al. | 361/689 |
| 5,835,345 A | * | 11/1998 | Staskus et al. | 361/699 |
| 6,014,312 A | * | 1/2000 | Schulz-Harder et al. | 361/699 |
| 6,351,384 B1 | * | 2/2002 | Daikoku et al. | 361/704 |
| 6,578,625 B1 | * | 6/2003 | Wyatt et al. | 165/80.3 |
| 6,651,735 B2 | * | 11/2003 | Cho et al. | 165/104.26 |
| 6,729,383 B1 | * | 5/2004 | Cannell et al. | 165/80.3 |
| 7,188,662 B2 | * | 3/2007 | Brewer et al. | 165/80.4 |
| 7,190,580 B2 | * | 3/2007 | Bezama et al. | 361/699 |
| 2004/0112571 A1 | * | 6/2004 | Kenny et al. | 165/80.3 |
| 2006/0002088 A1 | * | 1/2006 | Bezama et al. | 361/702 |

* cited by examiner

*Primary Examiner* — Tho V Duong
(74) *Attorney, Agent, or Firm* — F. Chau & Associates, LLC; Louis J. Percello, Esq.

(57) ABSTRACT

A cooler includes a base layer, a cooling layer including at least one inlet slot and at least one outlet slot for flowing a coolant across a cooling structure including a plurality of staggered fins arranged in rows and columns, wherein fins of adjacent columns are staggered, and at least one manifold layer disposed on the cooling layer for flowing the coolant from a cooler inlet to the at least inlet slot and from the at least one outlet slot to a cooler outlet, the at least one manifold layer having a top layer comprising the cooler inlet and the cooler outlet.

7 Claims, 13 Drawing Sheets

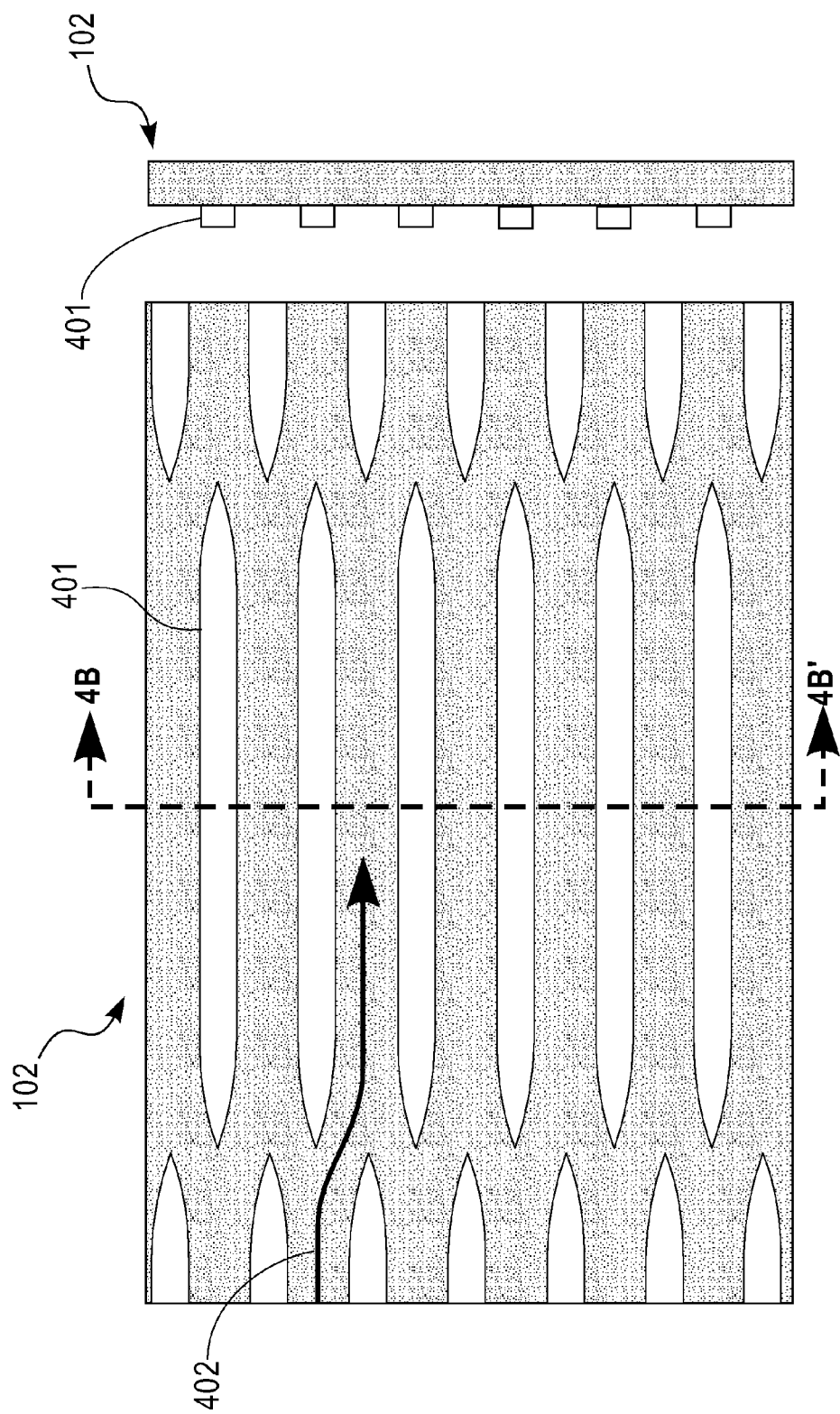

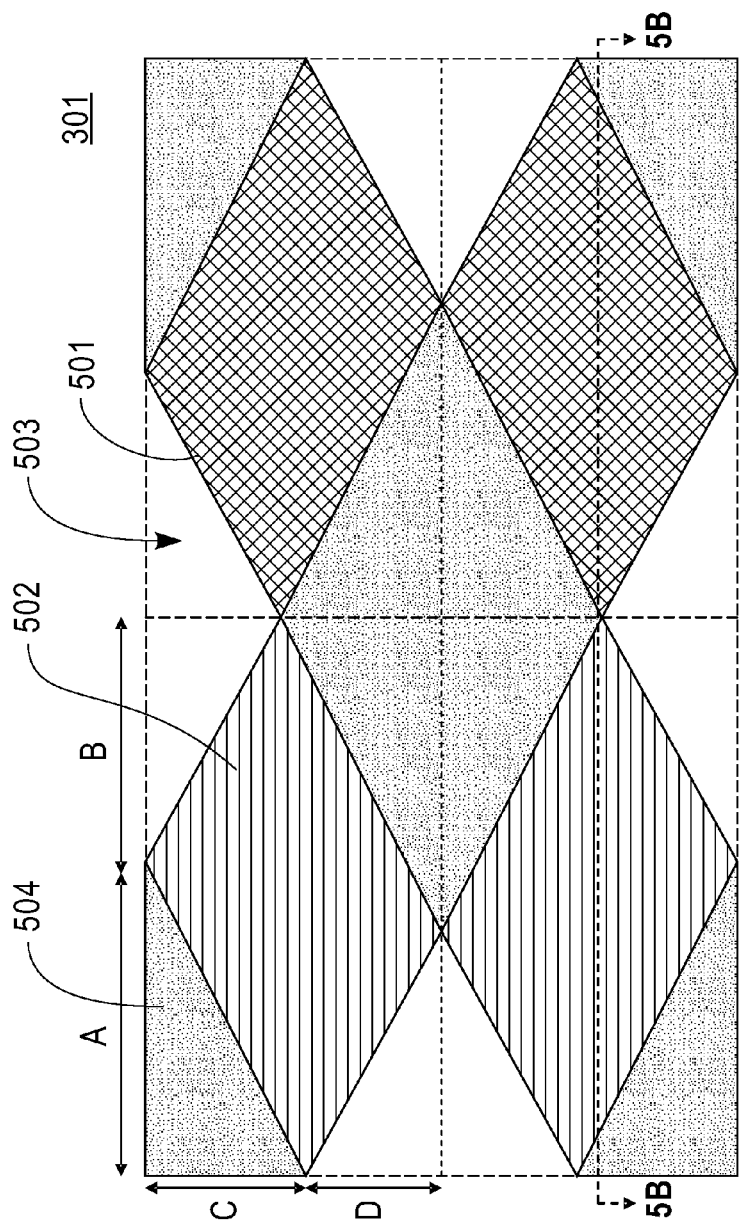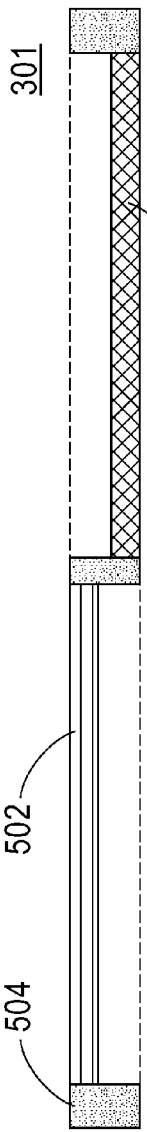
FIG. 5A
FIG. 5B

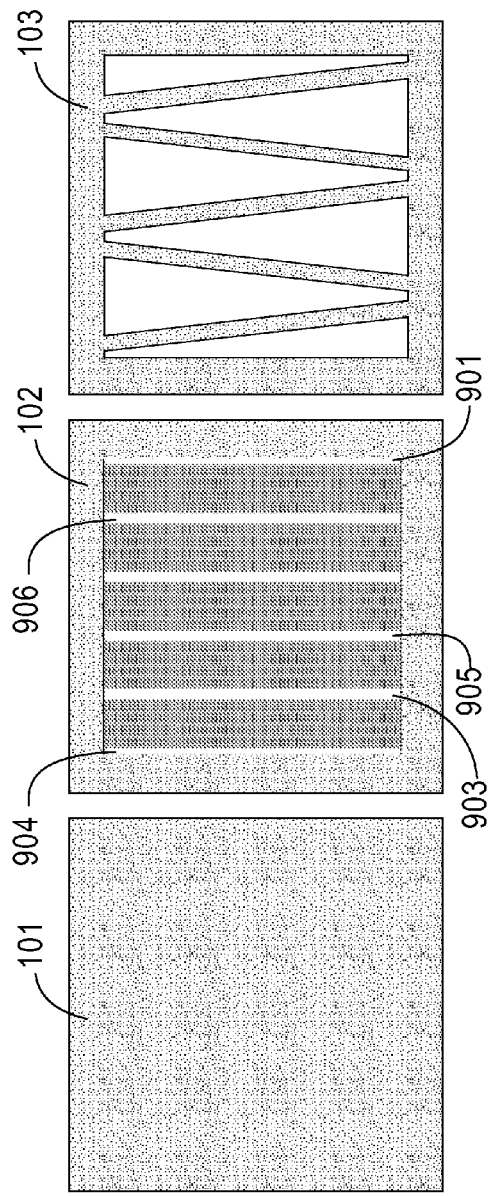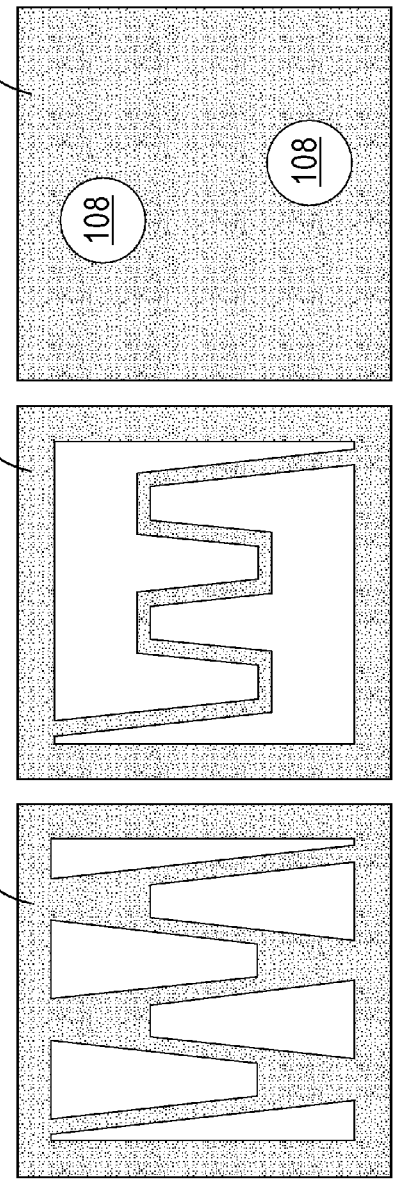

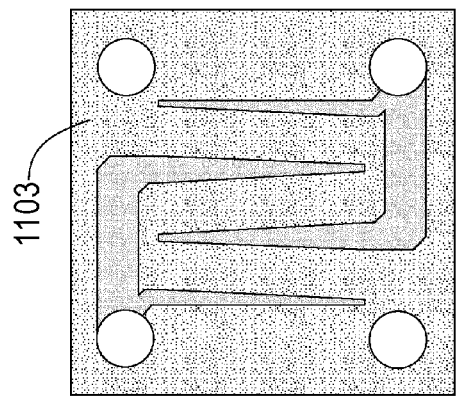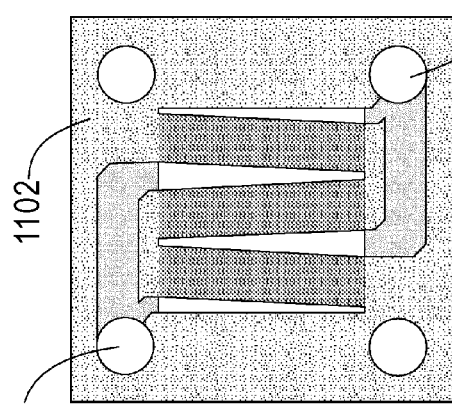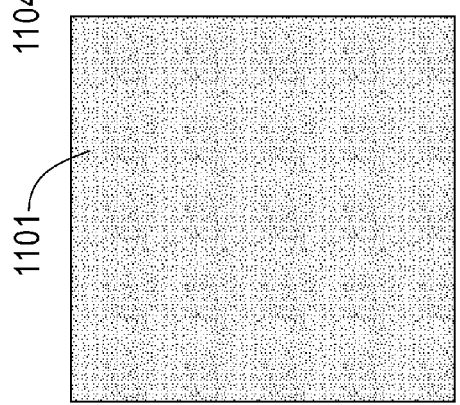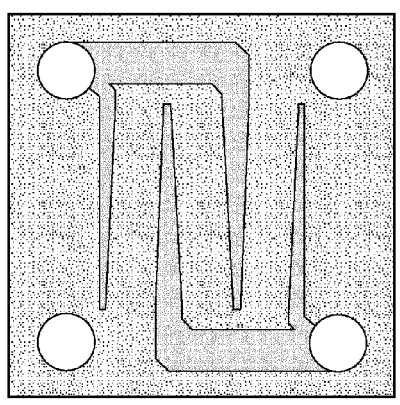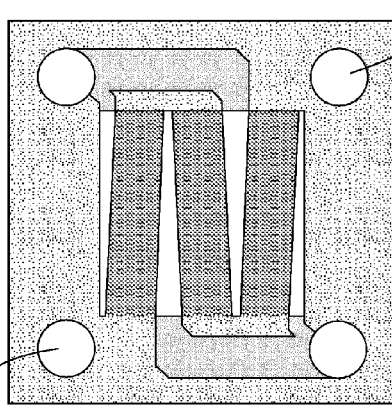
FIG. 12A
FIG. 12B
FIG. 12C
FIG. 12D
FIG. 12E

STACKED AND REDUNDANT CHIP COOLERS

BACKGROUND

1. Technical Field

The present invention relates to coolers for integrated circuit chips, and more particularly to stacked and redundant coolers.

2. Discussion of Related Art

As heat is generated during the functioning of integrated circuit chips (ICs), a thermal resistance from the chip junction to the ambient air or circulating cooling fluid needs to be low so that the operating temperature of the chip is maintained within tolerances to assure the continued reliable operation of the device. Heat removal becomes more difficult as chip geometry is scaled down and operating speeds are increased, resulting in increased power density. The ability to cool the chips can therefore be a limiting factor in the further increase of system performance.

Therefore, a need exists for a high performance cooler structure.

BRIEF SUMMARY

According to an embodiment of the present disclosure, a cooler includes a base layer, a cooling layer comprising at least one inlet slot and at least one outlet slot for flowing a coolant across a cooling structure comprising a plurality of staggered fins arranged in rows and columns, wherein fins of adjacent columns are staggered, and at least one manifold layer disposed on the cooling layer for flowing the coolant from a cooler inlet to the at least inlet slot and from the at least one outlet slot to a cooler outlet, the at least one manifold layer having a top layer comprising the cooler inlet and the cooler outlet.

According to another embodiment of the present disclosure, a cooler includes a base layer, a cooling layer comprising at least one inlet slot and at least one outlet slot for flowing a coolant across a cooling structure comprising a first single layer mesh having a continuous flow path, wherein the continuous flow path has a height greater than one half of a thickness of the first single layer mesh, a separator layer disposed between the cooler layer and the at least one manifold layer for confining the coolant flow into the mesh, and at least one manifold layer disposed on the cooling layer for flowing the coolant from a cooler inlet to the at least inlet slot from the at least one outlet slot to a cooler outlet, the at least one manifold layer having a top layer comprising the cooler inlet and the cooler outlet.

According to yet another embodiment of the present disclosure, a redundant cooler device includes a common base layer; and a plurality of stacked cooler groups. Each cooler group includes a cooling layer comprising at least one inlet slot and at least one outlet slot for flowing a coolant across a cooling structure, at least two of the cooler groups of the plurality of stacked cooler groups having distinct and independent coolant paths, and at least one manifold layer disposed on the cooling layer for flowing the coolant from a cooler inlet to the at least inlet slot and from the at least one outlet slot to a cooler outlet.

BRIEF DESCRIPTION OF THE SEVERAL VIEWS OF THE DRAWINGS

Preferred embodiments of the present disclosure will be described below in more detail, with reference to the accompanying drawings:

FIGS. 4A-B are a detailed schematic top and side view of a staggered fin layer used in the heat transfer portion, according to an exemplary embodiment of the present disclosure.

FIGS. 5A-B are a detailed schematic top and side view of a single layer mesh structure used in the heat transfer portion, according to an exemplary embodiment of the present disclosure.

FIGS. 9A-F are schematic top views of the individual layers for an alternate cooler structure with five heat exchanger zones, according to an exemplary embodiment of the present disclosure.

FIGS. 12A-E are schematic top views of the individual layers from which the redundant cooler in FIGS. 11 & 13 is built, according to an exemplary embodiment of the present disclosure.

DETAILED DESCRIPTION

Figure 1:
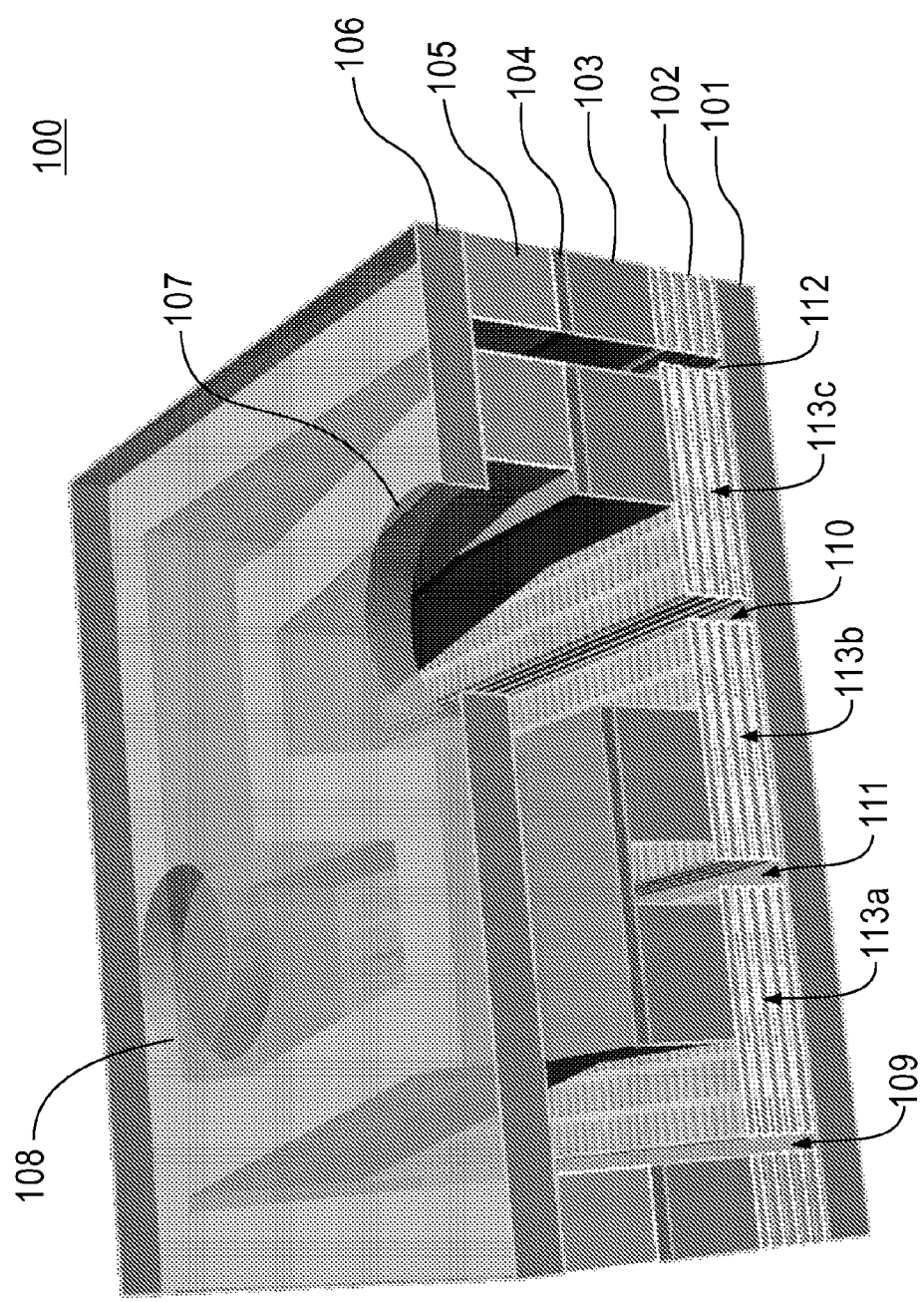
FIG. 1 is a schematic perspective view that illustrates a stacked cooler using staggered fin layers in the heat transfer portion according to an exemplary embodiment of the present disclosure.
Figure 2:
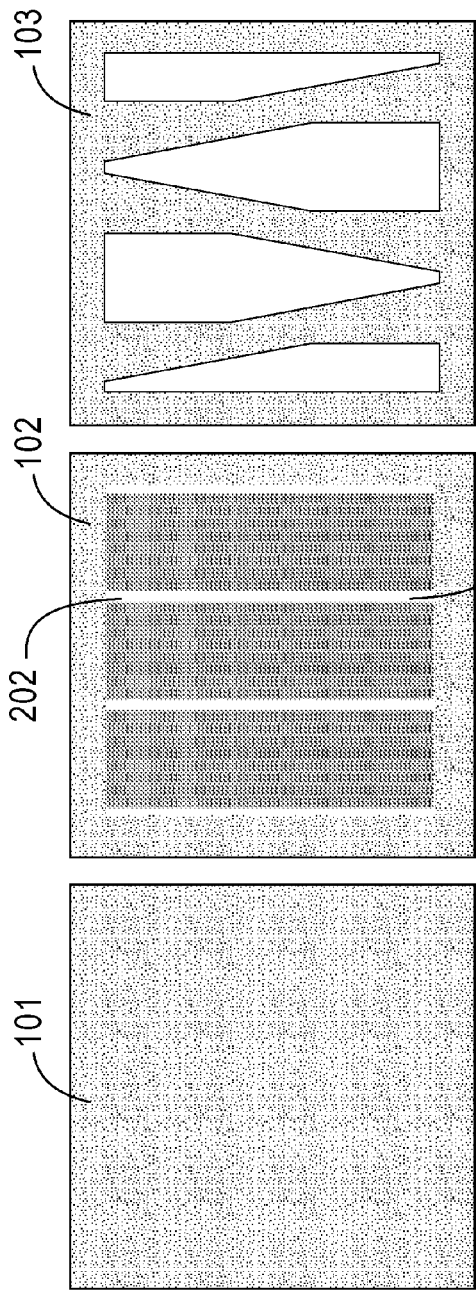
FIGS. 2A-F are schematic top views of the individual layers from which the structure in FIG. 1 is built, according to an exemplary embodiment of the present disclosure.
Figure 3:
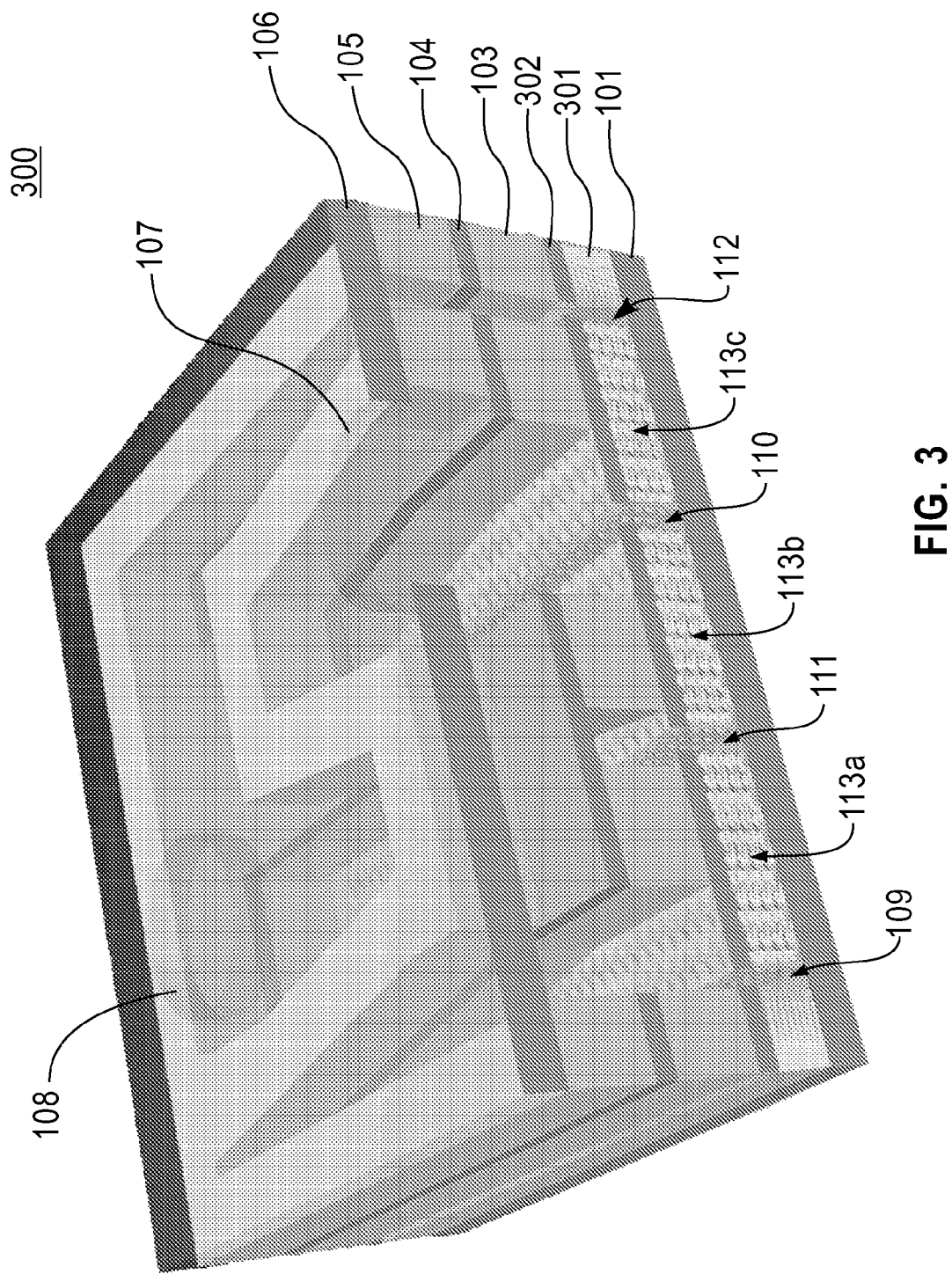
FIG. 3 is a schematic perspective view that illustrates a stacked cooler using single layer mesh structures in the heat transfer portion according to a further exemplary embodiment of the present disclosure.

FIGS. 1-2 show an exemplary embodiment of a stacked cooler according to the present disclosure. A schematic sectional perspective view of a cooler 100 using staggered fin layers (see 102, FIGS. 1 and 2B) in the heat transfer portion is shown in FIG. 1. Schematic top views of the individual layers, 101-106, from which the structure in FIG. 1 is built are shown in FIGS. 2A-F, respectively. A schematic sectional perspective view of another embodiment of a stacked cooler 300 using single layer mesh structure 301 in the heat transfer portion is shown in FIG. 3. In FIGS. 1 and 3 illustrating cross-sections of the cooler, a side thereof is not shown, and no fittings or other hose attachment hardware of the top surface 106 are shown for clarity. In FIGS. 2A-F, black indicates that the sheet is not etched, white that it is fully etched through, and gray that the sheet is partially etched through from one side. The structure in FIG. 1 is built-up by stacking and joining six unique types of layers, a base (101, FIG. 2A) which is preferably 0.6 mm thick and within the range of about 0.3 to 2.0 mm thick, multiple cooling structure layers 102, where in FIGS. 1 and 2B staggered fins 102 are used, see detail in FIGS. 4A-B. In an alternate embodiment, a single layer mesh structure (301 FIGS. 3 and 5A-B) could be used. The cooling structure layers, e.g., 102 and 301, are about 0.2 to 0.4 mm thick and are etched partially from one or both sides and are etched through where etched from both sides. The number of cooling structure layers are preferably 4 or 5 and between 2 and 8 layers. With staggered fins 102, the manifold portion of the cooler 100 is formed from three unique layers 103-105, shown in FIGS. 1 & 2C-E. The three unique manifold layers 103-105, from the top to the bottom, are designated as manifold layer 105 (FIG. 2E), manifold layer 104 (FIG. 2D), and manifold layer 103 (FIG. 2C). The manifold layers 103 and 105 are preferably 0.6 mm thick and between about 0.4 and 1.0 mm thick and the manifold layer 104 is preferably 0.2 mm thick and between about 0.2 and 0.4 mm thick. It should be understood that in the completed structure, multiple instances of some of the unique manifold layers 103 and 105 may be stacked together and joined to provide the desired cross sectional area in the manifold coolant channels. A top layer 106, which seals the manifold and provides for fluid inlet and outlet, is also shown in FIGS. 1 and 2F. Fittings, such as a hose barbs, or a threaded fitting to which an elbow, or a rotatable and positionable elbow (not shown) can be attached (e.g., bonded) to the top surface of layer 106 of the cooler 100 aligned with the openings 107-108 in the top layer 106.

In the embodiments shown in FIGS. 1 and 3, there are two inlet regions 109-110 and two outlet regions 111-112 in the cooling layers, which alternate, and which are aligned with corresponding structures in the manifold layers, resulting in three heat exchanger zones, e.g., 113a-c. When the cooling layers use staggered fins (see 102, FIG. 1), or parallel channels, slot shaped openings are formed through the cooling layers in the inlet and outlet regions to provide for coolant flow to and from the lower layers. When the cooling layers use a single layer mesh structure (see 301 FIG. 3) which allows vertical flow, in addition to the slots described above, an additional separator layer 302 is needed between the manifold layers 103-105 and the mesh layers 301 to confine the coolant flow into the mesh layers 301, as shown in FIG. 3. In a design stage, the width of the slots should be selected to balance the area available for heat transfer with the need for coolant flow.

The preferred structures of the cooling layer include staggered fins 102 shown in FIGS. 4A-B (FIG. 4B shows a cross-section 4B-4B' in FIG. 4A), or a single layer mesh structure, 301 shown in FIG. 5. With staggered fins, the fins (e.g., 401 in FIGS. 4A-B) at least one dimension of the fluid passages in the cooling layers may be about 100 microns or less in size. Either of these structures, FIGS. 4A-B & 5A-B (FIG. 5B shows a cross-section 5B-5B' in FIG. 5A), can be formed by patterning and etching thin copper sheets. For the staggered fin case, different depths may be etched from each side of the sheet where the channels between the staggered fins are preferably etched between about 50 and 80 microns deep (gray regions in FIG. 4A) and enough is etched from the other side of the sheet to form the slot shaped openings through the sheet for the coolant inlets and outlets. A stacked staggered fin structure allows for flow redistribution if a channel, e.g., 402, is obstructed (e.g., fluid flow is restored to the channel at the end of one fin segment, so cooling is not lost for the whole length of the heat exchanger zone, e.g., 113a shown in FIG. 1) and the performance is improved as the boundary layer which forms along the channel sides is periodically broken up and the fluid from the center of the channel along one set of fins is brought into contact with the wall in the next set of fins. Note that with the staggered fin structure, flow is not only possible along the direction parallel to the fins, but also in the direction perpendicular to the fins. In the mesh structure, approximately equal amounts may be etched from each side of thin copper sheets such that in regions which are etched from both sides, the copper sheet is etched all the way through. In the single layer mesh structure 301 shown in FIGS. 5A-B, the height of the channel in the horizontal direction (above or below light or dark gray regions 501-502) is less than the thickness of the copper sheet used. In FIGS. 5A-B, the light gray regions 501 are etched from the top and the dark gray regions 502 are etched from the bottom. Further, the height of the horizontal channel between these regions when the sheets are stacked is more than half the thickness of the initial copper sheet. Regions 504 are preferably vertically aligned to provide a thermal conduction path up/down to regions 501 and 502; regions 501, 502 and 503 may also be vertically aligned, respectively. Also, with this arrangement, the width of the vertical gaps 503 is not strongly dependent on the alignment of adjacent sheets as after a vertical flow segment (white region 503 in FIGS. 5A-B), the next horizontal flow segment can be in the same layer if needed. With this single layer mesh structure, a single layer could be used and it would provide a continuous flow path. Further, there is no need to use an even number of cooling layers to provide a uniform horizontal flow cross section through the structure as the stacked mesh structures can be identical in structure. Note that with this mesh structure, for a stack of cooling layers, flow is possible in all three directions.

Figure 6:
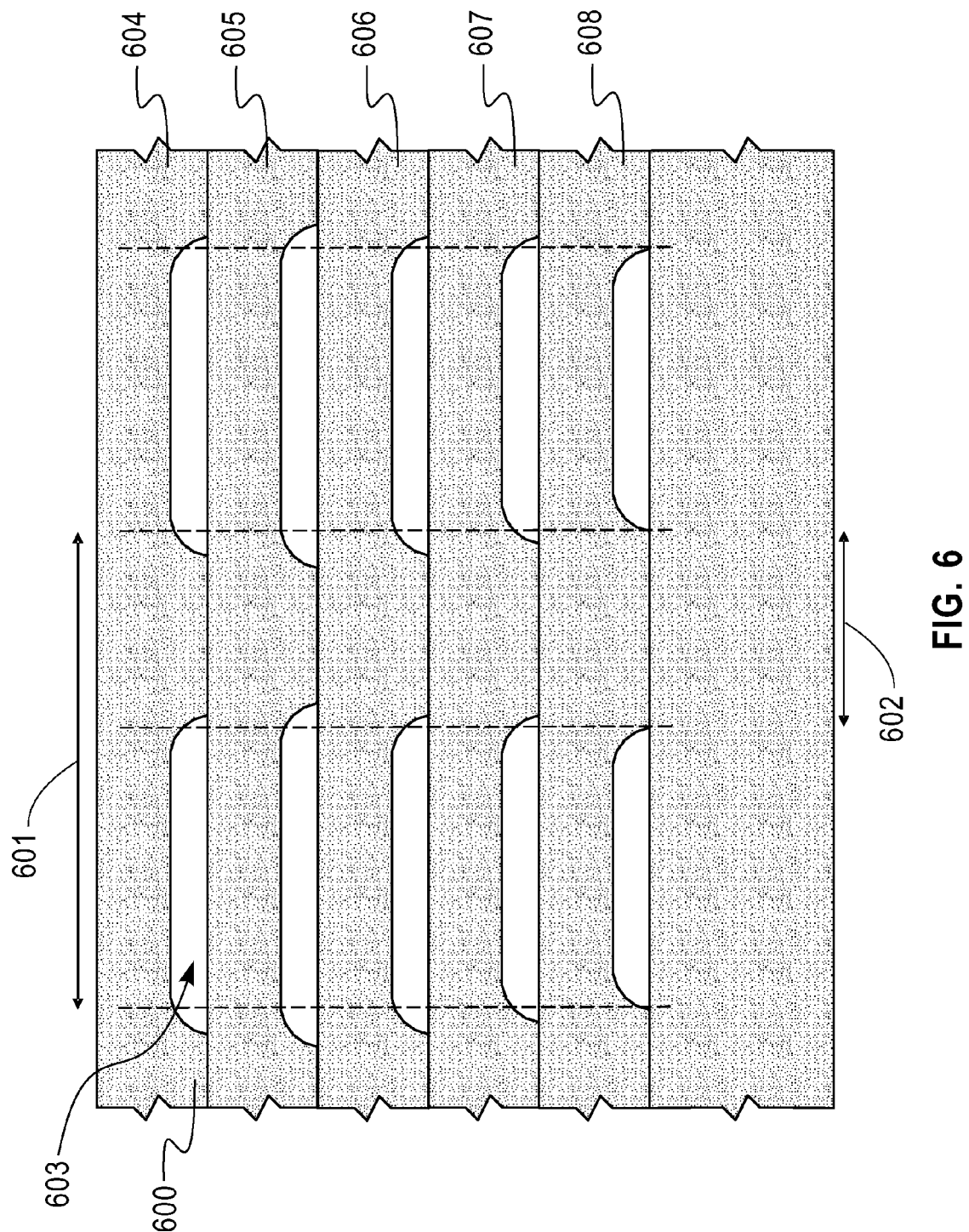
FIG. 6 is a detailed schematic side view of stacked staggered fin cooler layers viewed perpendicular to the fin (i.e. flow) direction showing wider fins in the bottom layer than in the top layer, according to an exemplary embodiment of the present disclosure.

In a further refinement of these structures, the performance can be slightly improved by varying the width of the fins in the staggered fin structure, or the diameter of the posts (black regions 504 in FIGS. 5A-B) in the mesh structure, in the stack of cooling layers so that the continuous vertical features are wider in the bottom layers than in the top layers. This is illustrated for staggered fins in FIG. 6, which is a schematic side view perpendicular to the fin (flow) direction. In all cases, the pitch 601 would be the same in all the layers (604-608) so that the fins 600, or posts, and channels 603 therebetween, would be aligned to each other. The width of fins 600 is shown as 602 for the bottom layer. Having a tapered width of the continuous vertical features, e.g., wider at the bottom than the top, reduces the thermal resistance to the upper cooling layers relative to a continuous vertical feature having a constant width equal to the average width of the tapered case.

Figure 7:
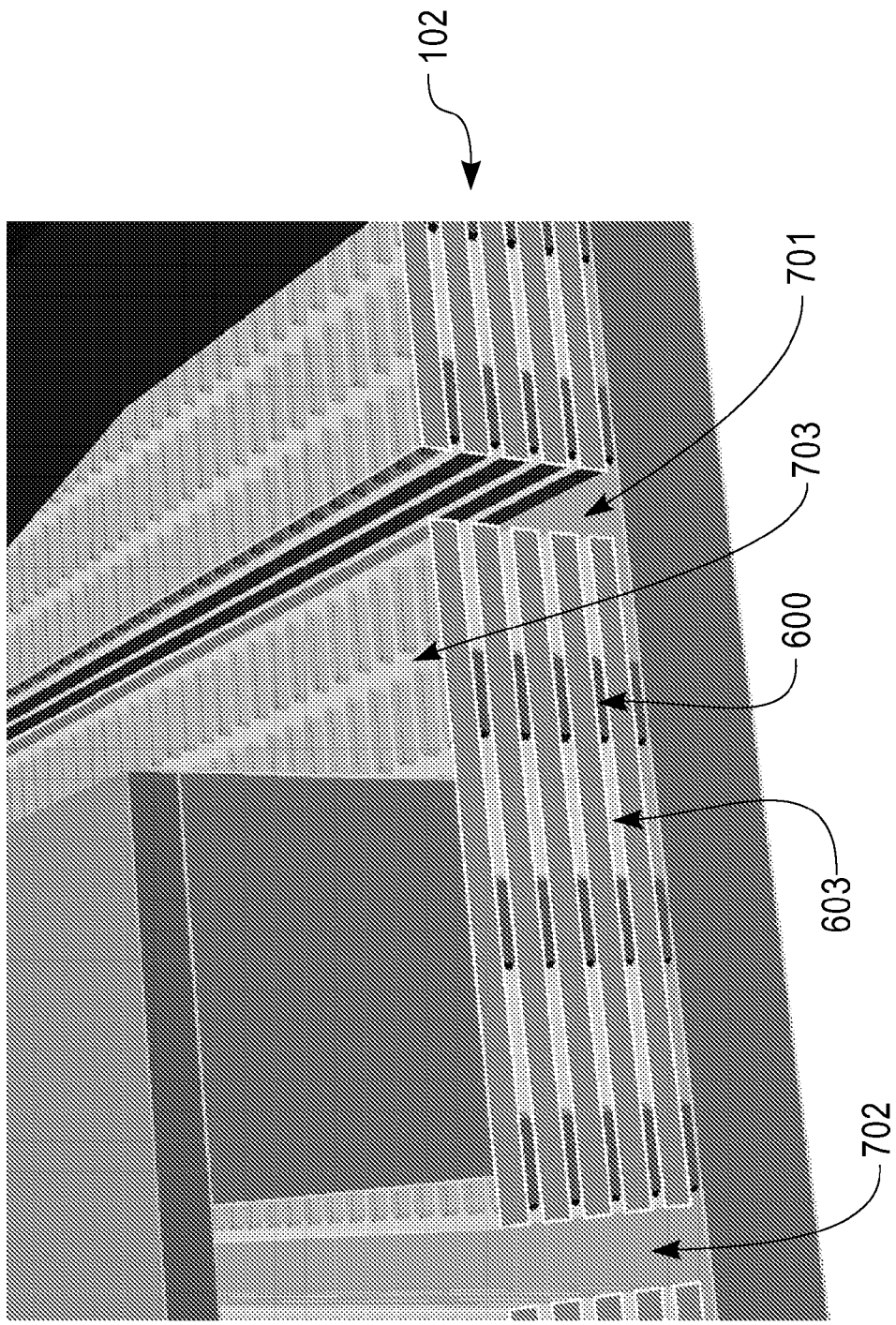
FIG. 7 is a detailed schematic perspective view of a portion of FIG. 1, according to an exemplary embodiment of the present disclosure.
Figure 8:
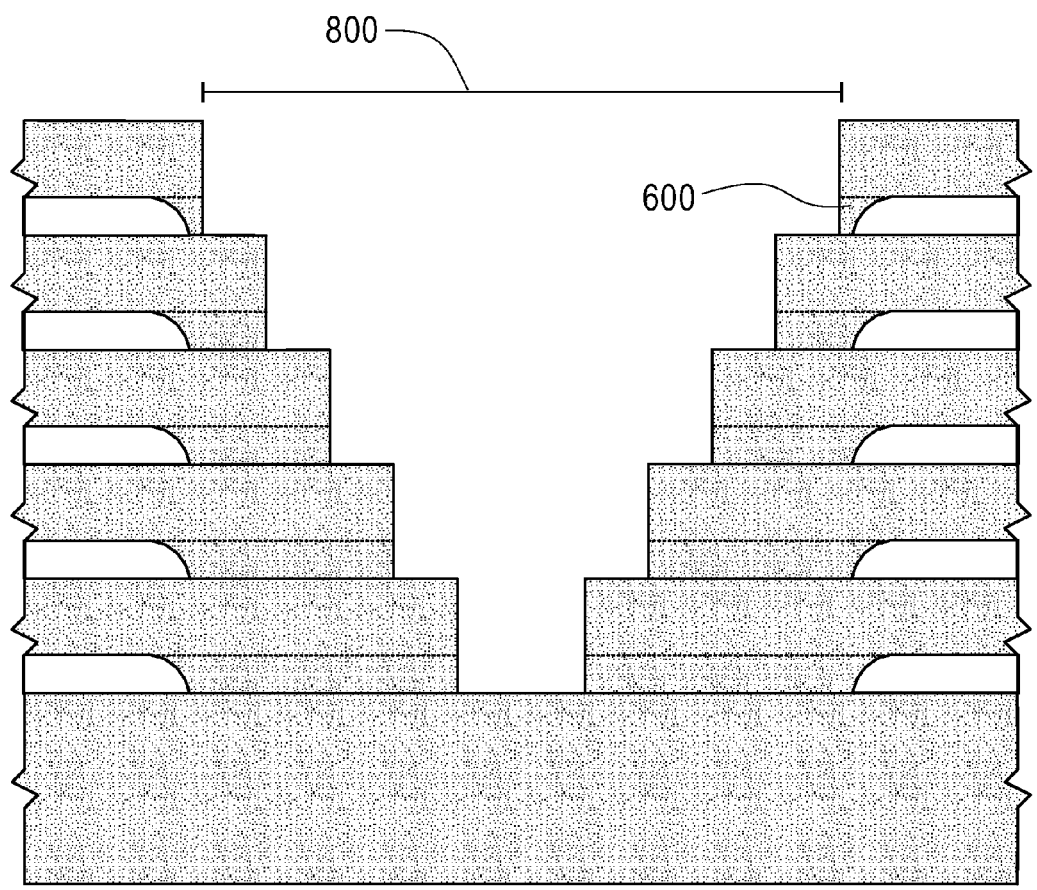
FIG. 8 is a detailed schematic side view of stacked staggered fin cooler layers viewed parallel to the fin (i.e. flow) direction showing a wider inlet/outlet opening in the top cooling layer than in the bottom cooling layer, according to an exemplary embodiment of the present disclosure.

If slot shaped openings in the cooling layers are used as coolant inlets/outlets, it is desirable that the width of the opening in the bottom cooling layer be as small as possible and less than or equal in width to twice the thickness of the bottom layer of the cooler so that thermal spreading in the bottom layer will provide adequate cooling for this region. A detailed perspective schematic view of an inlet 701 and an outlet 702 opening in the staggered fin layers 102 is shown in FIG. 7. The staggered offset fins 600 are also visible. In this case, a small gap, e.g., 703, is present between the rows of fins to ease the redistribution of coolant between the offset fins, unlike the case illustrated in FIG. 4, wherein any reduction of the fin length reduces the wetted area and therefore the heat transfer, though the case shown in FIG. 7 may have a reduced pressure drop. For the case shown in FIG. 7, all the cooling layers are identical. The flow distribution can be improved, and the width of the opening in the bottom cooling layer can be reduced, by varying the opening width e.g., 800 for the top layer, as shown in FIG. 8, which is a schematic side view parallel to the fin 600, or flow, direction, where the width of the opening in the cooling layers used as coolant inlets/outlets is varied (e.g., tapered or stepped) as a function of height of the opening, with the smallest opening width in the bottom layer and the largest opening width in the top layer. The width of the opening should be approximately equal to, or greater than, the open cross sectional area of the cooling layer or layers fed. For example, if the staggered fin channel pitch is 350 microns, the channel width is 250 microns, the channel depth is 80 microns, and the fin width is 100 microns, the open cross sectional area of the bottom cooling layer for each mm of width is $0.08 \times (250/350) \times 2 = 0.11$ mm$^2$/mm, where the factor of two is because the center inlet/outlet are feeding/being fed from both directions. So for the example shown in FIG. 8, the width of the opening e.g., 800, in the cooling layers should increase from bottom to top from 0.11, 0.23, 0.34, 0.46, and to 0.57 mm.

Referring to FIGS. 1, 2, and 3, the manifold structure will now be described. In FIG. 1, if the opening 107 in the top layer is an inlet, then the coolant flow path is first through said inlet 107 in the top layer and sequentially into the manifold layer(s) 105, 104 & 103. The inlet openings 109 and 110 in the cooling (heat transfer) layers 102 are located along the left edges of heat exchanger zones 113a and 113c respectively, and along the right edge of the center heat exchanger zone 113b. Coolant is provided to the front portion 201 of the inlet opening 110 by flowing through the aligned partially tapered openings in the first, second, and third manifold layers 103-105 directly under the inlet opening 107. Coolant is provided to the rear portion 202 of the inlet opening 110 by the manifold layer(s) 103 which extends under a solid portion 203 of the manifold layer 104 where the manifold layer(s) 105 provides a "crossover" channel to provide coolant to the outlet opening in the cooling layer on the right edge of the cooler at opening 112. The inlet opening 109 is provided with coolant by a crossover channel formed in the manifold layer(s) 105 which is isolated by the manifold layer 104 from the coolant outlet path provided in the manifold layer(s) 103 to the outlet opening 111. The inlet crossover channel is connected to a set of partially tapered openings in the first, second, and third manifold layer (s). The manifold channels which extend over the inlet/outlet openings in the cooling layers are not fully tapered in this case, but they could be fully tapered as shown in FIGS. 9A-F. The layer definitions are the same as in FIG. 2A-F, but the design has been modified to have 5 heat exchanger zones (e.g., 3 inlets 901-903 alternating with 3 outlets 904-906), instead of 3 heat exchangers zones as in FIGS. 1-3.

The manifold structure is located above the active area of the cooler and the inlet/outlet openings 109 & 112 or 901 & 904 in the cooling layers 102 or 301 along two opposite sides of the cooler 100 or 300, and does not extend beyond these areas. The flow from the manifold structure into the inlet/outlet openings of the cooling layers is largely vertical; there is no need to enlarge the openings in the cooling/heat transfer layers to support any horizontal manifold flow. The individual thickness, and number of the first and third manifold layers, can be adjusted to provide a cross sectional area which is approximately equal to the open area of the cooling layers which are being provided with coolant, or from which coolant is returning. The resulting cooler is compact and has a minimum x-y size beyond the cooled area.

Figure 10:
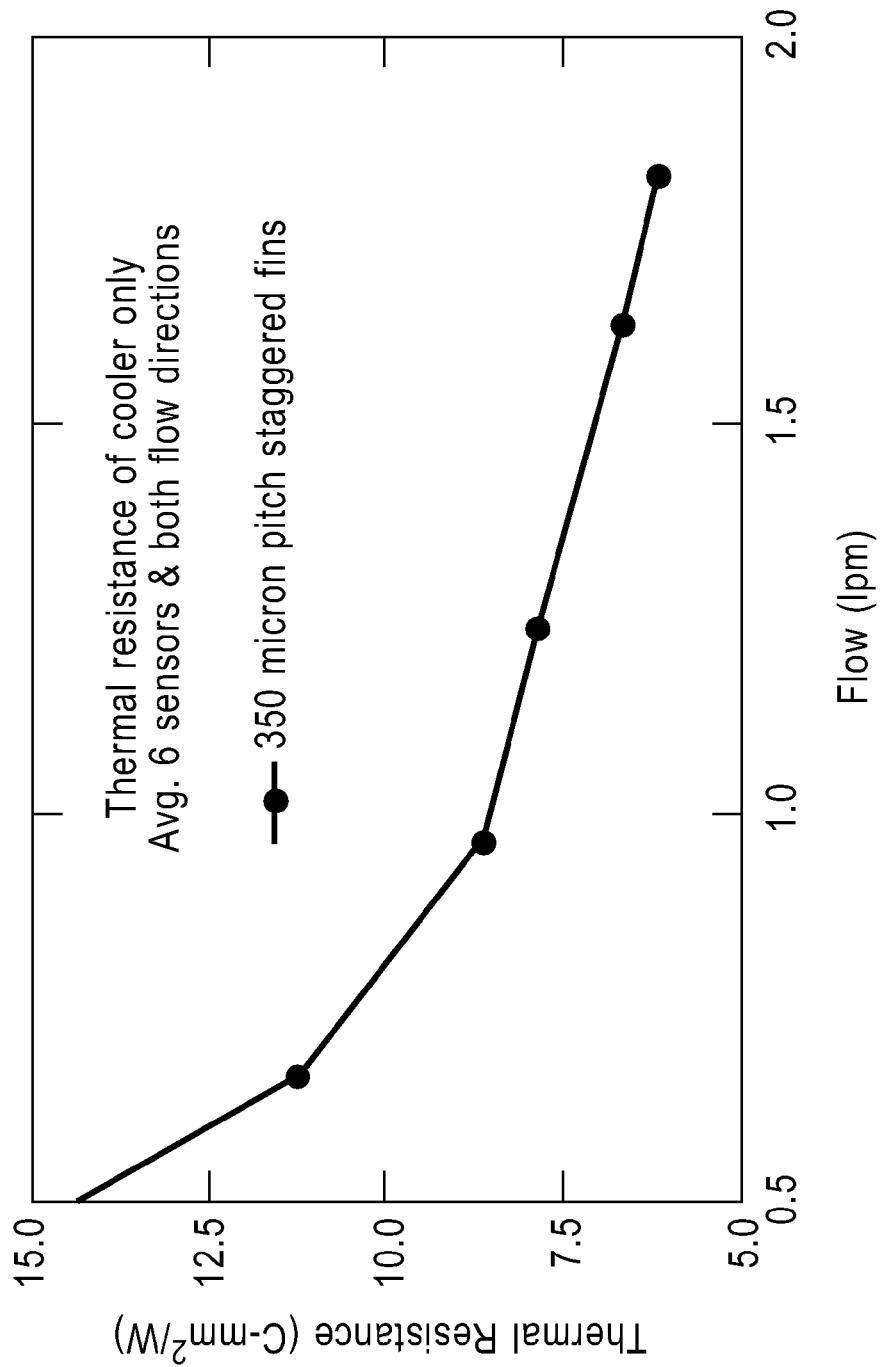
FIG. 10 is a plot of the thermal performance versus flow of a cooler fabricated using the design illustrated schematically in FIGS. 1 & 2, according to an exemplary embodiment of the present disclosure.

Coolers have been fabricated using the design schematically illustrated in FIGS. 1 and 2. The active cooled area (including the inlet/outlet openings along two edges) is 18.5×18.5 mm and the overall size is 22.5×22.5 with a height of 4.8 mm, not including the fittings. The base layer was 0.6 mm thick, the five cooling layers, with staggered fins, were each 0.2 mm thick, the third manifold portion 103 was composed of two layers each 0.6 mm thick, the second manifold layer 104 was 0.2 mm thick, the first manifold portion 105 was also composed of two layers each 0.6 mm thick, and the top layer was 0.6 mm thick. The staggered fins were each 100 microns wide, on a 350 micron pitch and the flow regions around the fins were etched about 65 microns into the 0.2 mm copper sheets. The sheets were joined together by the so called direct copper bonding process using a copper oxide eutectic. The cooler was attached to a thermal test chip which was well matched to the active area in size with a compliant thermal interface material (TIM) and the thermal resistance was measured. The unit thermal resistance plotted in FIG. 10 is just for the cooler; the portion due to the Si chip and TIM has been subtracted. The values are based on the temperature difference between the inlet water and the temperature of the chip mid way between a fluid inlet and outlet. The values from six temperature sensors on the chip were averaged and were also averaged for both flow directions, reversing inlets and outlets. With a flow rate of 1.25 lpm, the average thermal resistance value was 7.8 C-mm$^2$/W. For sensors which are located at an inlet or outlet region, reversing the flow direction resulted in the thermal resistance changing by about 8% with a flow rate of 1.25 lpm. For a similar cooler with five heat exchanger zones, as illustrated in FIG. 9, for sensors which are located at an inlet or outlet region, reversing the flow direction resulted in the thermal resistance changing by about 5% with a flow rate of 1.25 lpm. The percentage change increased as the coolant flow rate was reduced and decreased as the coolant flow rate was increased. These results demonstrate how aligning hot spots (e.g., a region with power density greater than about 1.5 times than an average power density) with inlet regions can be used to provide additional local cooling, especially when few heat exchanger zones are used. The amount of additional local cooling under and inlet was reduced as the number of heat exchanger zones was increased.

Extensive computational fluid dynamic simulations, using commercially available code, have been performed on the single layer mesh cooling structures shown in FIGS. 3 and 5. The pitch is equal to $(2 \times (A+B))$ and the percent post area is equal to $(A \times C)/((A+B) \times (C+D))$ where the dimensions A through D are defined in FIG. 5A. The coolant flow direction in FIGS. 5A-B would be from left to right or right to left, in the elongated direction. With other variables kept constant, the thermal resistance was found to decrease linearly with the pitch between 1 and 3 mm for a fixed coolant flow rate. The thermal resistance was also found to decrease linearly as the percent post area was increased between 30 and 50 percent. Using thinner copper layers (0.2 vs. 0.3 mm thick) and having fewer heat exchanger zones (3 vs. 5) was also found to improve the thermal performance with a fixed flow rate. Increasing the number of mesh layers from four to six was found to reduce the thermal performance, with a fixed flow rate for the conditions considered. The aspect ratio, which is equal to $(A+B)/(C+D)$, had a mixed effect and depended on other design parameters. The preferred range of aspect ratio is between about 1 and 2.5. For designs using four 0.2 mm thick Cu sheets and three heat exchanger zones, with pitches between 1 and 1.22 mm, 30 or 40% post area, and aspect ratios between 1.5 and 2.5, the expected average thermal resistance value with a flow rate of 1.25 lpm predicted by computational fluid dynamic simulations ranged from 7.0 to 7.3 C-mm$^2$/W, which compares favorable with the measure value reported above for staggered fins. In these designs, the minimum opening size would be significantly larger (>100 microns) than that in the stacked staggered fin structures, which reduced the potential risk of particles clogging the flow channels.

The unexpectedly higher thermal performance of the mesh cooler design with larger gap sizes relative to the thermal performance of stacked staggered fins can be attributed to increased mixing with the mesh design. The mesh structure promotes greater laminar flow mixing in the space between channel regions (fully etched region 503 in FIG. 5A), while the flow space between staggered fins provides a structured flow path that just splits the flow and does not promote such flow mixing. In the mesh structure, as the flow moves from one channel region (partially etched regions below 502 on the left side of FIGS. 5A-B) to the next channel region (partially etched regions above 501 on right side of FIGS. 5A-B), the flow must not only change directions in the x-y (Cu sheet) plane, but it is also largely displaced vertically as the flow moves from etched regions or channels in the bottom of the sheets which comprises the initial channel region, after the open mixing region, into subsequent etched regions or channels above or below in the sheets. Note that due to the over-etching from the top and bottom, about 50-90% of a channel region, or horizontal flow segment, is vertically offset in the next channel region. For the preferred range of aspect ratios, between 1 and 2.5, in each mixing space between channels, the flow is redirected in the plane of the copper sheets by between about 40 and 95 degrees, and more preferably between 44 and 90 degrees. It is desirable to use laminar flow mixing instead of turbulent flow mixing due to the lower pressure drop for a given flow rate.

Figure 11:
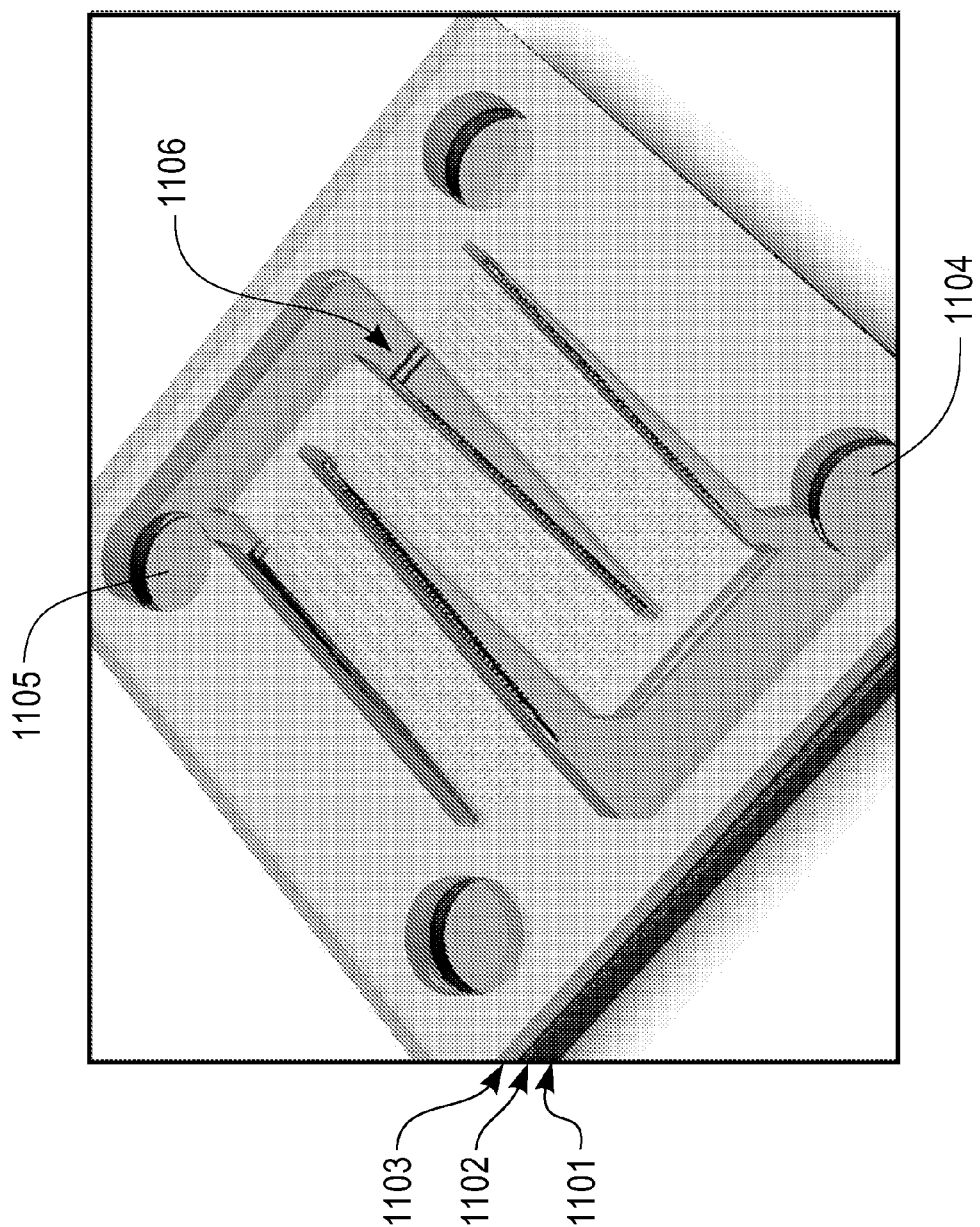
FIG. 11 is a schematic perspective view of a portion of a redundant cooler including the base and one group, according to an exemplary embodiment of the present disclosure.

In a further embodiment, a cooler structure is also needed which has two distinct and independent coolant paths, which has a minimal reduction in performance when only one of the coolant paths is used, and where the thermal resistance of the cooler when only one of the two coolant paths is used has a similar performance to the case where only the other coolant path is used. To achieve these goals, some of the constraints described above for a stacked cooler need to be relaxed. According to an exemplary embodiment of the present disclosure, the x-y dimension of the redundant stacked cooler is increased to accommodate forming part of the manifold structure along the sides. The structure of the redundant stacked cooler can best be understood with reference to FIGS. 11-13. FIG. 11 is a schematic perspective view of a portion of a redundant cooler including a base 1101, which is preferably 1 mm thick and in the range of about 0.5 to 2.5 mm thick, and one group. A group includes two cooling layers 1102, each of which are preferably between 0.2 to 0.4 mm thick, and one manifold layer 1103, which is about 0.4 to 0.8 mm thick, and are connected to two 1104-1105 of the four inlet/outlet openings located at the corners of the cooler, in this case, ones which are diagonally across from each other. The structure of the individual layers used can be understood with reference to FIGS. 12A-E, which are schematic top views of the individual layers from which the redundant cooler is built. The base 1101, which is solid and contains no etched features, is shown in FIG. 12A—in other embodiments the base 1101 may include etched features. A cooling layer 1102, which belongs to group "A" is shown in FIG. 12B where staggered fins are used as the cooling structure. Other cooling structures such as stacked channels, and multi or single layer mesh structures could also be used. In FIG. 12B, black indicates no etching, gray indicates that the Cu layer is partially etched from the bottom side, and white indicates that the Cu layer is fully etched through. The cooling layer is fully etched through, white regions in FIG. 12B, to provide tapered manifold channels (see for example, 1106, FIG. 11) for additional lateral, and vertical, distribution of the coolant. Note that FIG. 12D, which is a cooling layer for group "B" is identical to FIG. 12B except that it is rotated by 90°. The cooling layer for group "B" could also have been generated by a mirror operation along either a horizontal or vertical axis through the center of FIG. 12B. The cooling structure of group "B" is connected to different inlet/outlet openings than are used for group "A". For the case shown, the cooling structure was removed from a portion of the cooling layer to provide additional flow area for the coolant supply and return. Depending on the detailed design, removing the cooling structure from these regions may not be required. A manifold layer 1103 for group A is shown in FIG. 12C where again gray indicates that the copper layer is partially etched from the bottom side. Similar to the cooling layers, FIG. 12E shows a manifold layer for group B. The complete stacked redundant cooler structure is formed by stacking and joining multiple A and B groups onto a base layer. The uppermost manifold layer can be made from a thicker-than-typical copper layer, with the same manifold etch depth, so as to provide a thicker top layer on the cooler. As discussed previously, various types of fittings can be joined onto the top of the cooler. In this case, two inlet and two outlets would be needed for the two independent coolant paths.

Figure 13:
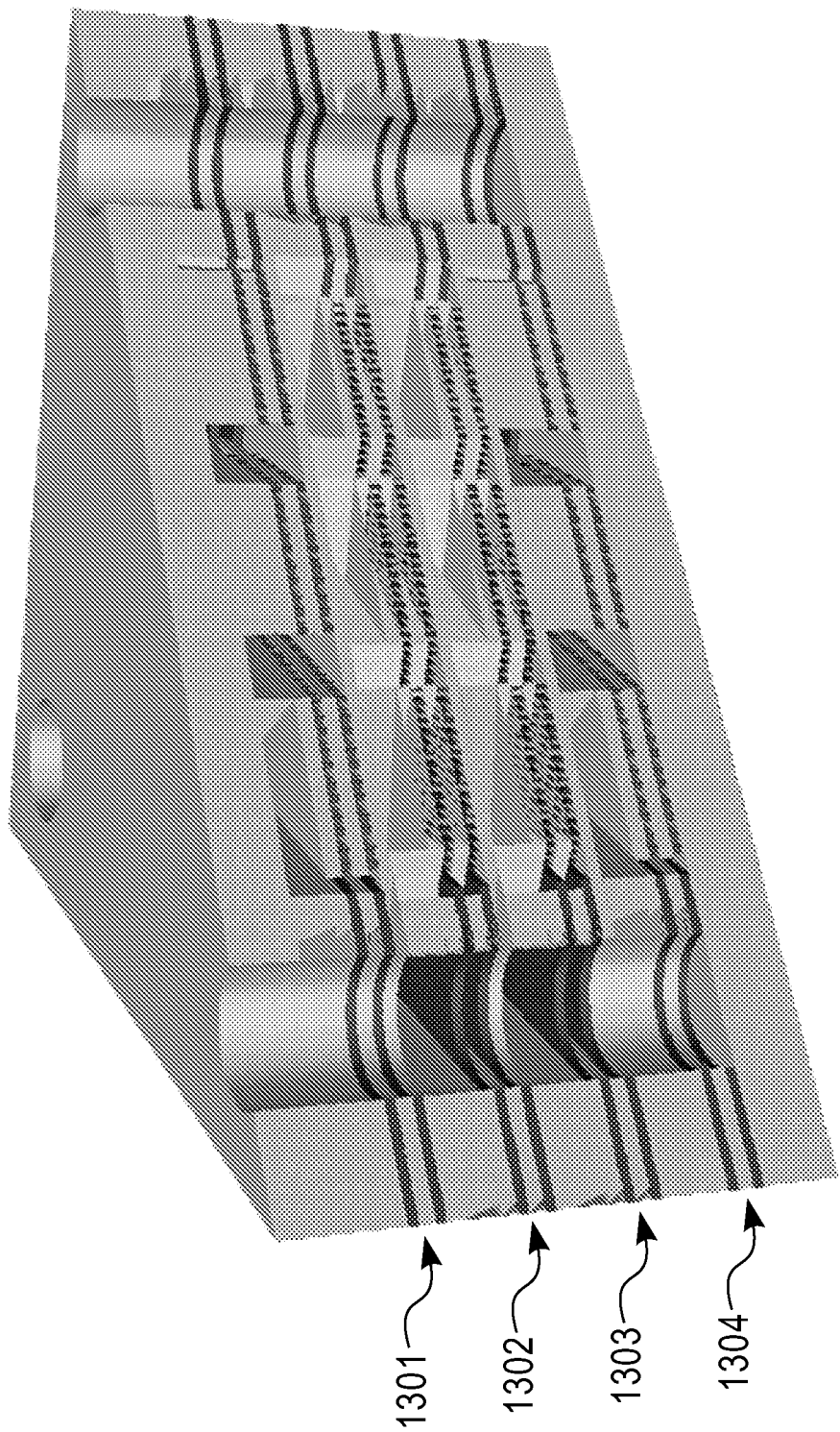
FIG. 13 is schematic perspective sectional view of a redundant cooler according to an exemplary embodiment of the present disclosure.

The complete structure of the stacked redundant cooler can be understood with reference to FIG. 13, which is a schematic perspective sectional view according to an exemplary embodiment of the invention. The bottom layer is a base which is 0.6 mm thick. All the cooling structure layers are 0.2 mm thick and the etch depth from the bottom is 0.08 mm. The bottom three manifold layers are 0.4 mm thick where etch depth from the bottom is 0.3 mm, and the top manifold layer is 0.8 mm thick where again the etch depth from the bottom is 0.3 mm. In the case shown in FIG. 13, the cooler includes four groups 1301-1304 where the top and bottom groups (1301 and 1304) are of the same type (e.g., type A for example) and the middle two groups (1302-1303) are also of the same type, but different from that used in the top and bottom groups (e.g., type B for example). As mentioned previously, the type A groups are connected to one inlet/outlet pair and the type B groups are connected to a separate and independent inlet/outlet pair. Each group includes a pass-thru inlet/outlet pair, e.g., 1104' and 1105' aligned with the inlet/outlet pair of the other group, e.g., 1104 and 1105 (see FIGS. 12D and 12B, respectively). The multiple coolant flow paths are arranged in a stacked manner with multiple heat exchanger zones to reduce the pressure drop. The redundant cooler includes a stack of multiple groups where each group includes cooling and manifold layers.

The thermal performance of a redundant stacked cooler has been examined by computational fluid dynamics using commercially available software, see Table 1. To simplify the calculations, the cooling structure used was just stacked straight channels with a channel depth of 80 microns, a pitch of 350 microns, and a channel width of 250 microns for the equal channel width case. The cooling layers were all 200 microns thick, the manifold layers were 400 microns thick, and the base was 1000 microns thick. The model assumed a fixed heat transfer coefficient for channels filled with flowing coolant (e.g., water) and a heat transfer coefficient of zero for channels filled with air. The cooling layer area was not reduced to allow for manifolding. The cooler considered included four groups in total, where two different configurations were considered, the groups were either arranged as A/B/A/B with an A group on the bottom and a B group on the top, or as A/B/B/A with an A group on the top & bottom and B groups in the center. In addition to the equal channel width case, a variable channel width case was also considered where in the bottom group, the channel width was reduced to 210 microns, in the top group, the channel width was increased to 290 microns, and in the middle groups, the channel width remained the same at 250 microns. In all cases, the channel pitch was fixed at 350 microns. This resulted in a tapered fin structure similar to that illustrated in FIG. 6 where the fins are wider at the base and narrower in the upper layers. The cooler thermal resistance for the different cases considered are shown in Table 1. From these results, it can be seen that the A/B/B/A flow configuration results in less thermal difference between the case with water flow in A/air in B vs. the case with water flow in B/air in A, especially with the variable width channels, and that the use of variable width channels improves the performance in all cases.

TABLE 1

| Configuration | Equal Channels | Variable Channels |
|---|---|---|
| Flow in all 4 groups | 9.6 C.-mm$^2$/W | 9.3 C.-mm$^2$/W |
| ABAB, flow in A & air in B | 12.0 C.-mm$^2$/W | 11.9 C.-mm$^2$/W |
| ABAB, flow in B & air in A | 15.7 C.-mm$^2$/W | 14.4 C.-mm$^2$/W |
| ABBA, flow in A & air in B | 12.5 C.-mm$^2$/W | 12.4 C.-mm$^2$/W |
| ABBA, flow in B & air in A | 15.0 C.-mm$^2$/W | 13.9 C.-mm$^2$/W |

In an actual use condition, the thermal resistance of the cooler is less than, or approximately equal to, the thermal resistance of the TIM and the chip, so the percentage change in the total thermal resistance is much less than the above values would suggest. For example, if the thermal resistance of the chip is 5.6 C-mm$^2$/W and the TIM is 12.0 C-mm$^2$/W, then with variable width channels and flow in all 4 groups, the total thermal resistance would be 26.9 C-mm$^2$/W. With an ABBA configuration, variable channels, and flow only in the B groups, this value would be increased to 31.5 C-mm$^2$/W or an increase of less than 20%. However, this percent difference could increase with the use of advanced TIM materials such as solder, which has a lower thermal resistance.

A cooler according to an embodiment of the present disclosure may be integrated into the 1$^{st}$ level package containing the chip to be cooled as described in U.S. patent application Ser. No. 12/120,029, filed on May 13, 2008, entitled "Semiconductor Package Structures Having Liquid Coolers Integrated with First Level Chip Package Modules", which has common co-inventors and which is herein incorporated by reference in its entirety. With such integration, for a ball grid array (BGA) type package, the cooler is constructed of materials which can survive one or more Pb-free reflow process (260° C.) such as is used for attaching the package onto a printed circuit board. For use in computer racks, a reliable and leak proof design is needed. A unitary design is preferred where the outside structure of the cooler is all joined together by soldering, brazing, eutectic bonding, or other metallurgical joining means and circular seal rings or other types of gaskets are not used to contain the coolant in the cooler, though such circular seal fittings or other gaskets may be used to provide a fluid connection to the cooler.

Having described embodiments for stacked and redundant coolers, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A cooler comprising:
a base layer;
a cooling layer disposed on the base layer and comprising at least one inlet slot and at least one outlet slot for flowing a coolant across a cooling structure comprising at least three heat exchange zones, wherein a first inlet slot is disposed between a first adjacent pair of the heat exchange zones and a first outlet slot is disposed between a second adjacent pair of the heat exchange zones, the cooling structure comprising a plurality of staggered fins arranged in rows and columns, wherein fins of adjacent columns are staggered; and
a multilayer manifold disposed on the cooling layer for flowing the coolant from a cooler inlet to the at least one inlet slot and from the at least one outlet slot to a cooler outlet, the multilayer manifold having a bottom layer, a first intermediate layer, a second intermediate layer, and a top layer sequentially disposed on the cooling layer, the top layer comprising the cooler inlet and the cooler outlet, the bottom layer comprising a plurality of tapered slots disposed over respective ones of the inlet slots and outlet slots, the first intermediate layer comprising a plurality of chambers corresponding to respective ones of the tapered slots of the bottom layer, and the second intermediate layer connecting groups of the chambers to one of the cooler inlet and the cooler outlet.

2. The cooler of claim 1, wherein the inlet slot and outlet slot have an opening wider at a top portion adjacent to the at least one manifold layer and narrower at a bottom portion adjacent to the base layer.

3. The cooler of claim 1, wherein the base layer is coupled to a heat source, and wherein the inlet slot is aligned to a predetermined portion of the heat source, wherein an inlet slot region provides enhanced cooling as compared to an outlet slot region of the cooler.

4. The cooler of claim 1, wherein the manifold layers have a pair of inlet slots disposed at an active area of the cooling layer and a pair of outlet slots disposed away from the active area.

5. The cooler of claim 1, wherein the cooler has a unitary construction.

6. The cooler of claim 1, wherein the cooling layer includes a plurality of stacked fin layers, and a width of the fins decreases from a bottom fin layer adjacent to the base to a top fin layer adjacent to the manifold layer where a spacing between fins perpendicular to a flow direction is substantially constant.

7. The cooler of claim 1, wherein the cooling layer is stacked with at least another cooling layer.

* * * * *